United States Patent
Bamesberger et al.

(10) Patent No.: US 9,971,249 B1
(45) Date of Patent: May 15, 2018

(54) METHOD AND SYSTEM FOR CONTROLLED ULTRAVIOLET LIGHT EXPOSURE

(71) Applicant: Canon Kabushiki Kaisha, Tokyo (JP)

(72) Inventors: Seth J. Bamesberger, Austin, TX (US); Yeshwanth Srinivasan, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/443,196

(22) Filed: Feb. 27, 2017

(51) Int. Cl.
*G03F 7/20* (2006.01)
*G03F 7/00* (2006.01)

(52) U.S. Cl.
CPC .............. *G03F 7/7045* (2013.01); *G03F 7/00* (2013.01); *G03F 7/0002* (2013.01); *G03F 7/2047* (2013.01); *G03F 7/70033* (2013.01); *G03F 7/7035* (2013.01)

(58) Field of Classification Search
CPC ........ G03F 7/0002; G03F 9/7042; G03F 9/00; G03F 7/00; G03F 7/0017; G03F 7/7035; G03F 5/14; G03F 7/2014; G03F 7/2047; G03F 7/7045; G03G 15/225; G11B 5/865
See application file for complete search history.

(56) References Cited

U.S. PATENT DOCUMENTS

| | | | |
|---|---|---|---|
| 6,873,087 B1 | 3/2005 | Choi et al. | |
| 6,932,934 B2 | 8/2005 | Choi et al. | |
| 7,157,036 B2 | 1/2007 | Choi et al. | |
| 2004/0124566 A1 | 7/2004 | Sreenivasan et al. | |
| 2004/0188381 A1 | 9/2004 | Sreenivasan | |
| 2004/0211754 A1 | 10/2004 | Sreenivasan | |

(Continued)

FOREIGN PATENT DOCUMENTS

| | | |
|---|---|---|
| JP | 2008183810 A1 | 8/2008 |
| JP | 2011181548 A1 | 9/2011 |
| JP | 2013089663 A1 | 5/2013 |

(Continued)

OTHER PUBLICATIONS

Eric J. Hansotte et al., "High speed maskless lithography of printed circuit boards using digital micromirrors", Proc. SPIE 7932, Emerging Digital Micromirror Device Based Systems and Applications III, Feb. 11, 2011, 14 pages.

(Continued)

*Primary Examiner* — Michelle M Iacoletti
(74) *Attorney, Agent, or Firm* — Fish & Richardson P.C.

(57) ABSTRACT

Methods, systems, and apparatus for identifying a non-rectangular shape outline of a first field of a substrate, the first field directly adjacent to a second field; adjusting an exposure profile of an ultraviolet light beam based on the non-rectangular shape outline of the first field to provide a non-rectangular exposure profile of the ultraviolet light beam; disposing a polymerizable composition on the first field of the substrate; contacting the polymerizable composition in the first field with an imprint lithography template; and while contacting the polymerizable composition in the first field with the imprint lithography template, directing the ultraviolet light beam having the non-rectangular exposure profile towards the substrate such that the ultraviolet light beam irradiates only the first field of the substrate.

20 Claims, 6 Drawing Sheets

(56) References Cited

U.S. PATENT DOCUMENTS

2005/0187339 A1    8/2005   Xu et al.
2013/0120725 A1*  5/2013   Van Der Mark ...... B82Y 10/00
                                                                 355/53

FOREIGN PATENT DOCUMENTS

JP         2014120604 A1    2/2016
JP         2016018824 A1    2/2016
JP         2016058735 A1    4/2016

OTHER PUBLICATIONS

B. J. Lin, "Optical Lithography", SPIE Press, Bellingham, WA, 2009, p. 136.
G. Hadipoespito et al., "Digital micromirror device based microstereolithography for micro structures of transparent photopolymer and nanocomposites", Proceedings of 14th Solid Freeform Fabrication Symposium, Austin, TX, 2003, pp. 13-24.
D. W. Rosen, "Stereolithography and Rapid Prototyping", BioNanoFluidic MEMS, 2008, pp. 175-196.
S. A. Lee, et al., "Three-dimensional fabrication of heterogeneous microstructures using soft membrane deformation and optofluidic maskless lithography", Lab Chip, 2009;9, pp. 1670-1675.
S.M. Sotomayor Torres et al., "Nanoimprint lithography: an alternative nanofabrication approach," Materials Science and Engineering: C, vol. 23, Issues 1-2, Jan. 2003, pp. 23-31.
S.V. Sreenivasan et al., "Enhanced nanoimprint process for advanced lithography applications". Semiconductor Fabtech 25th Edition, 2005, pp. 107-113.

* cited by examiner

METHOD AND SYSTEM FOR CONTROLLED ULTRAVIOLET LIGHT EXPOSURE

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed.

Imprint lithography is capable of imprinting a myriad of field sizes, field shapes, and surface topographies on a substrate. However, in typical imprint lithography, during ultraviolet light cure, the ultraviolet light beam exposure profile and energy profile remain constant regardless of field size, field shape, and surface topography.

SUMMARY

Innovative aspects of the subject matter described in this specification may be embodied in a method including identifying a non-rectangular shape outline of a first field of a substrate, the first field directly adjacent to a second field; adjusting an exposure profile of an ultraviolet light beam based on the non-rectangular shape outline of the first field to provide a non-rectangular exposure profile of the ultraviolet light beam; disposing a polymerizable composition on the first field of the substrate; contacting the polymerizable composition in the first field with an imprint lithography template; and while contacting the polymerizable composition in the first field with the imprint lithography template, directing the ultraviolet light beam having the non-rectangular exposure profile towards the substrate such that the ultraviolet light beam irradiates only the first field of the substrate.

Other embodiments of these aspects include corresponding systems configured to perform the actions of the methods.

These and other embodiments may each optionally include one or more of the following features. For instance, the non-rectangular exposure profile of the ultraviolet light beam is perpendicular to a path along which the ultraviolet light beam is directed. Adjusting the exposure profile of the ultraviolet light beam includes adjusting one or more parameters of the ultraviolet light beam to achieve the non-rectangular exposure profile of the ultraviolet light beam. Adjusting the one or more parameters of the ultraviolet light beam includes inhibiting a portion of the ultraviolet light beam from irradiating the substrate. Adjusting the exposure profile of the ultraviolet light beam includes matching the exposure profile of the ultraviolet light beam to the non-rectangular shape outline of the first field to provide the non-rectangular exposure profile of the ultraviolet light beam.

The features further include matching the exposure profile of the ultraviolet light beam to the non-rectangular shape outline of the first field includes identifying a first portion of the ultraviolet light beam that corresponds to the first field of the substrate; identifying a second portion of the ultraviolet light beam that corresponds to the second field of the substrate; directing the first portion of the ultraviolet light beam towards the substrate such that the first portion of the ultraviolet light beam irradiates only the first field of the substrate; and inhibiting the second portion of the ultraviolet light beam from irradiating the second field of the substrate. The second field of the substrate is not irradiated with the ultraviolet light beam. The first field tessellates with the second field of the substrate based on the non-rectangular shape outline of the first field of the substrate.

The features further include determining an energy threshold to cure the polymerizable composition disposed in the first field of the substrate; adjusting an energy profile of the ultraviolet light beam based on the energy threshold to provide an adjusted energy profile associated with a particular duty cycle; and while contacting the polymerizable composition in the first field with the imprint lithography template, directing the ultraviolet light beam having the non-rectangular exposure profile and the adjusted energy profile towards the substrate such that the ultraviolet light beam irradiates only the first field of the substrate at the particular duty cycle.

Innovative aspects of the subject matter described in this specification may be embodied in a system including a substrate chuck configured to hold a substrate, the substrate comprising a surface having a first field and a second field, the first field directly adjacent to the second field, the first field associated with a non-rectangular shape outline; a template chuck configured to hold an imprint lithography template, the imprint lithography template comprising a patterning surface; an imprint head coupled to the template chuck and configured to adjust a distance between the surface of the substrate and the patterning surface of the imprint lithography template; a digital micromirror device (DMD) configured to direct an ultraviolet light beam towards the substrate; and a processor in communication with the DMD and the imprint head, the processor configured to: i) provide a first signal to the DMD to adjust an exposure profile of the ultraviolet light beam based on the non-rectangular shape outline of the first field to provide a non-rectangular exposure profile of the ultraviolet light beam, and ii) provide a second signal to the DMD to direct the ultraviolet light beam having the non-rectangular exposure profile towards the substrate such that the ultraviolet light beam irradiates only the first field of the substrate.

Other embodiments of these aspects include corresponding method configured to perform the actions of the system.

These and other embodiments may each optionally include one or more of the following features. For instance, an ultraviolet light source configured to provide the ultraviolet light beam. In response to the first signal, the DMD adjusts one or more parameters of the ultraviolet light beam to achieve the non-rectangular exposure profile of the ultraviolet light bream. In response to the second signal, the DMD inhibits a portion of the ultraviolet light beam from irradiating the substrate. The first field tessellates with the second field of the substrate based on the non-rectangular shape outline of the first field of the substrate. The processor is configured to provide the first signal to the DMD to match the exposure profile of the ultraviolet light beam to the non-rectangular shape outline of the first field to provide the non-rectangular exposure profile of the ultraviolet light beam. The processor is configured to provide the second signal to the DMD to i) direct a first portion of the ultraviolet light beam towards the substrate such that the first portion of the ultraviolet light beam irradiates only the first field of the substrate and ii) inhibit a second portion of the ultraviolet light beam from irradiating the second field of the substrate.

Particular implementations of the subject matter described in this specification can be implemented so as to realize one or more of the following advantages. Implementations of the present disclosure provide a controllable ultraviolet light beam exposure profile to match field sizes of a substrate to reduce or prevent unwanted exposure and curing in fields adjacent to the exposed field (and thus further enable multi-field fluid dispense). Further advantages include a controllable ultraviolet light beam energy profile to modulate the ultraviolet light intensity for controlled curing.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
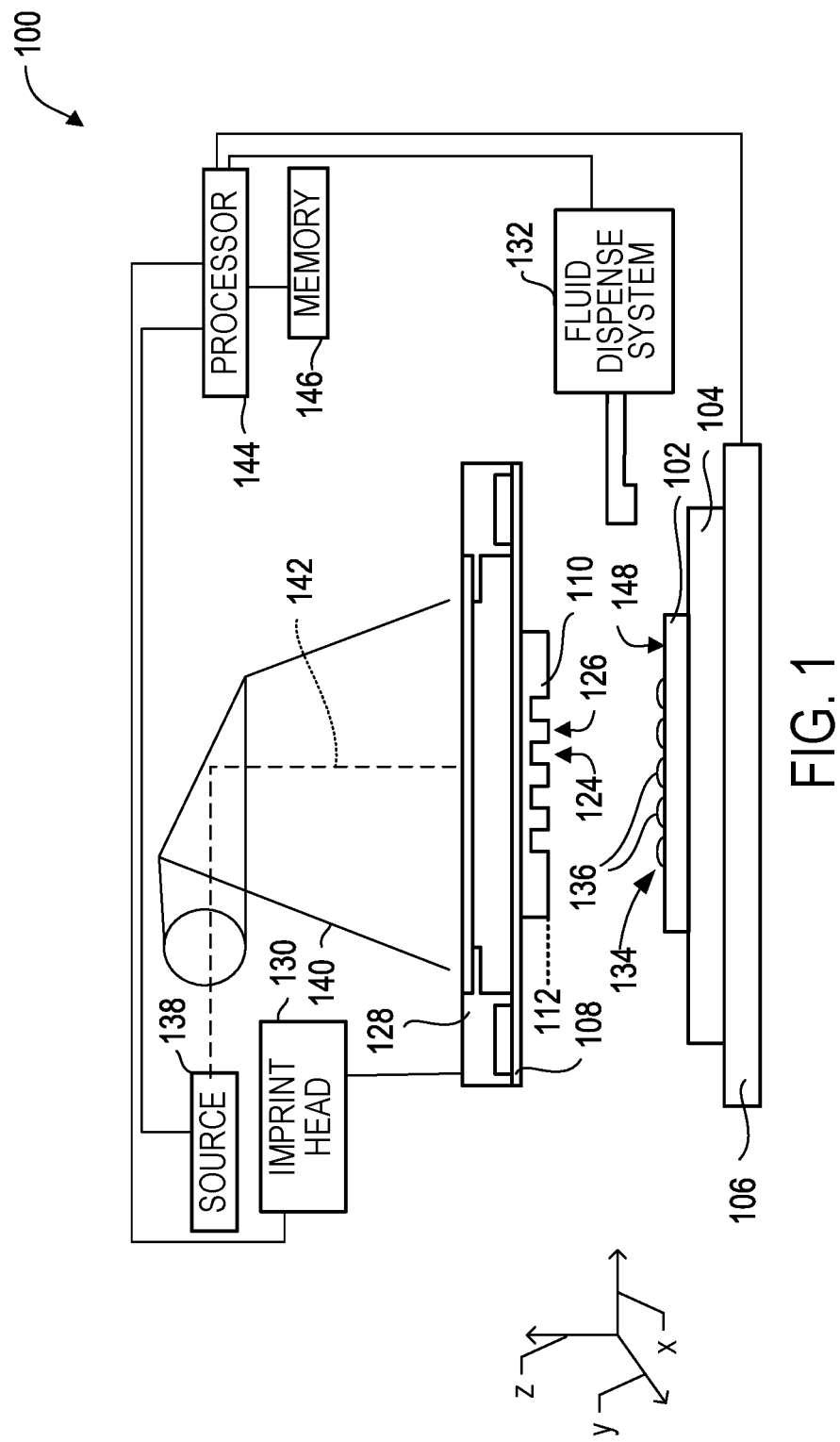
FIG. 1 illustrates a simplified side view of a lithographic system.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and the like. Exemplary chucks are described in U.S. Pat. No. 6,873,087, which is hereby incorporated by reference herein. The substrate 102 and the substrate chuck 104 may be further supported by a stage 106. The stage 106 provides motion about the x- and y-axes, and rotation about the z-axis. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108, the mold 110, or both, may be formed from such materials including, but not limited to, fused-silica, quartz, silicon, organic polymers, siloxane polymers, borosilicate glass, fluorocarbon polymers, metal, hardened sapphire, and the like. In the illustrated example, the patterning surface 112 includes a plurality of features defined by spaced-apart recesses 124 and protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and the like. Exemplary chucks are described in U.S. Pat. No. 6,873,087. Further, the template chuck 128 may be coupled to an imprint head 130 such that the template chuck 128 and/or the imprint head 130 may be configured to facilitate movement of the template 108.

The imprint lithography system 100 may further include a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and the like. In some examples, the polymerizable material 134 is positioned upon the substrate 102 before a desired volume is defined between the template 108 and the substrate 102. In some examples, the polymerizable material 134 is positioned upon the substrate 102 after the desired volume is defined between the template 108 and the substrate 102. The polymerizable material 134 may include a monomer as described in U.S. Pat. No. 7,157,036 and U.S. Patent Application Publication No. 2005/0187339, all of which are hereby incorporated by reference herein. In some examples, the polymerizable material 134 is disposed on the substrate 102 as a plurality of droplets 136.

Figure 2:
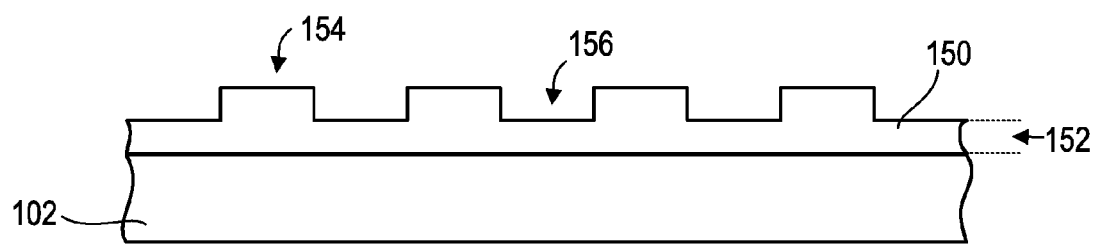
FIG. 2 illustrates a simplified side view of the substrate shown in FIG. 1 having a patterned layer positioned thereon.

Referring to FIGS. 1 and 2, the imprint lithography system 100 may further include an energy source 138 coupled to direct energy 140 along a path 142. In some examples, the imprint head 130 and the stage 106 is configured to position the template 108 and the substrate 102 in superimposition with the path 142. The imprint lithography system 100 may be regulated by a processor 144 in communication with the stage 106, the imprint head 130, the fluid dispense system 132, and the energy source 138, and may operate on a computer readable program stored in a memory 146.

In some examples, the imprint head 130, the stage 106, or both, vary a distance between the template 108 and the substrate 102 to define a desired volume therebetween that is filled by the polymerizable material 134. For example, the imprint head 130 may apply a force to the template 108 such that the patterning surface 112 contacts the polymerizable material 134. After the desired volume is filled by the polymerizable material 134, the energy source 138 produces energy 140, e.g., broadband ultraviolet radiation, causing the polymerizable material 134 to solidify, cross-link, or both, thereby conforming to the shape of a surface 148 of the substrate 102 and the patterning surface 112, defining a patterned layer 150 on the substrate 102. In some examples, the patterned layer 150 includes a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

Traditionally, in imprint lithography systems, an ultraviolet light beam is emitted from a source and directed towards a wafer to cure an (imprinted) polymerizable composition positioned thereon. Typically, the exposure profile (beam profile) of the ultraviolet light beam is circular and is the same for each imprint formed regardless of the field size and field shape of the imprint. This may result in unwanted light exposure of fields adjacent to the exposed field and the curing of polymerizable composition positioned in these adjacent fields. Further, the energy profile of the ultraviolet light beam may not be controllable for different field sizes, shapes, mask topographies, etc. Thus, it may be advantageous to provide a system and a method that provides customizable exposure profiles (beam profiles) of the ultraviolet light beam to reduce or prevent unwanted exposure and curing of polymerizable compositions positioned in adjacent fields; and further provides customizable energy profiles of the ultraviolet light beam for controlled curing of the polymerizable composition. Additionally, it may be advantageous to provide a system and a method that provides customizable exposure profiles (beam profiles) of the ultraviolet light beam to reduce or prevent thermal distortions in adjacent fields to the exposed field.

Figure 3:
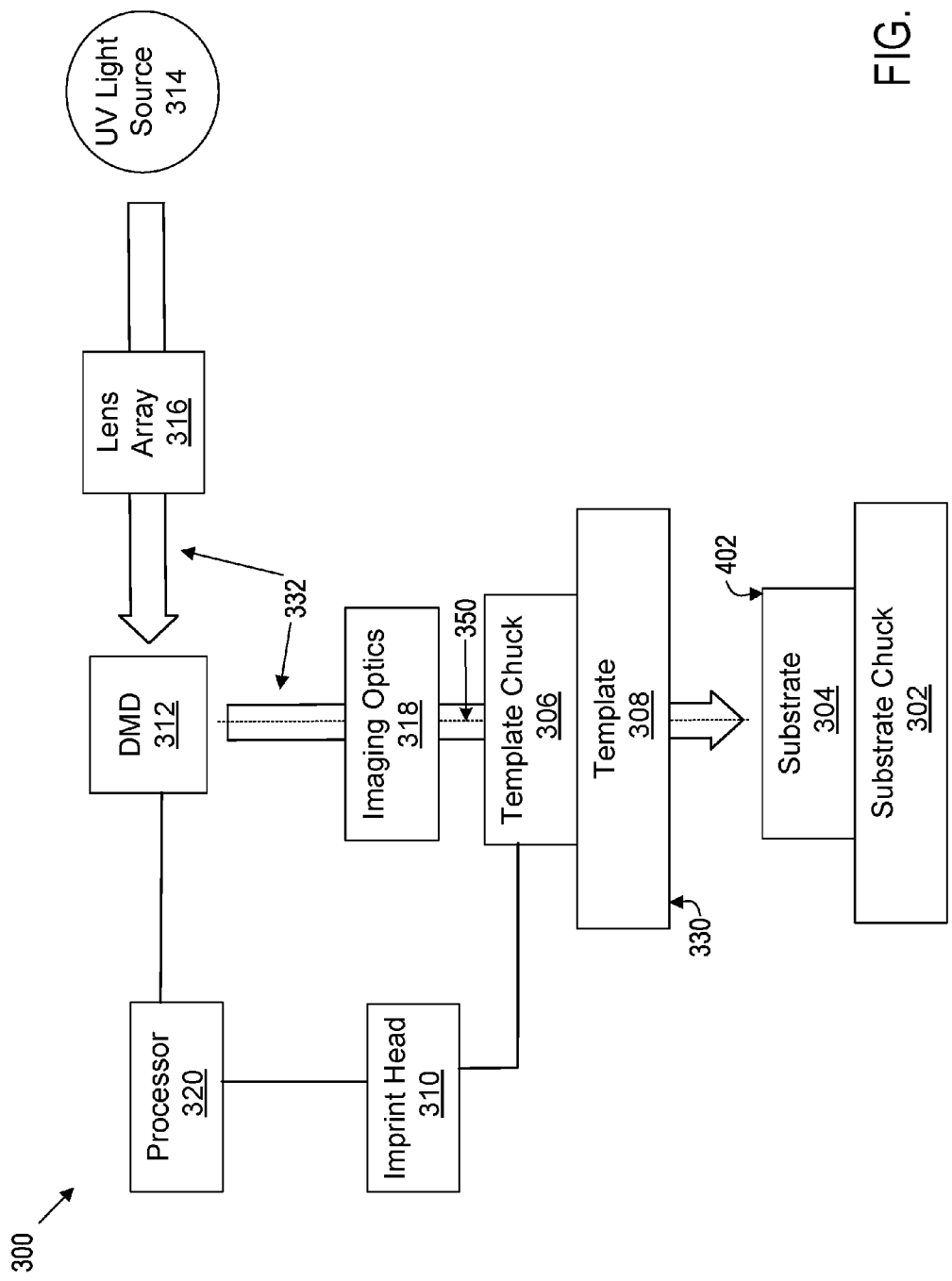
FIG. 3 illustrates a system for directing an ultraviolet light beam to a substrate.

FIG. 3 illustrates a system 300 for directing an ultraviolet light beam towards a substrate. The system 300 includes a substrate chuck 302, a substrate 304, a template chuck 306, a template 308, an imprint head 310, a digital micromirror device (DMD) 312, an ultraviolet light source 314, a lens array 316, imaging optics 318, and a processor 320.

Figure 4:
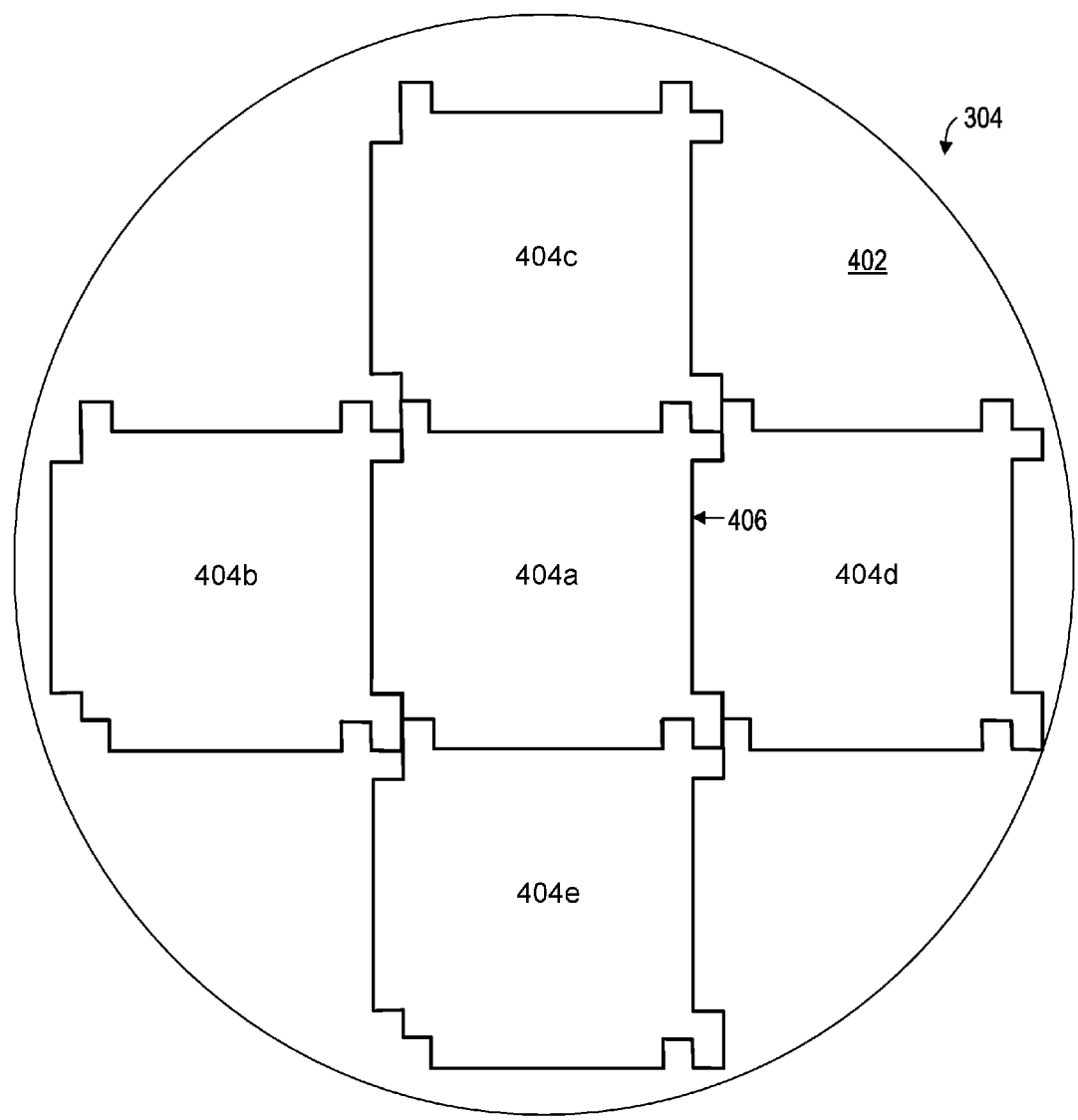
FIGS. 4 and 6 illustrate a plurality of fields of the substrate positioned in a tessellated pattern.
Figure 6:
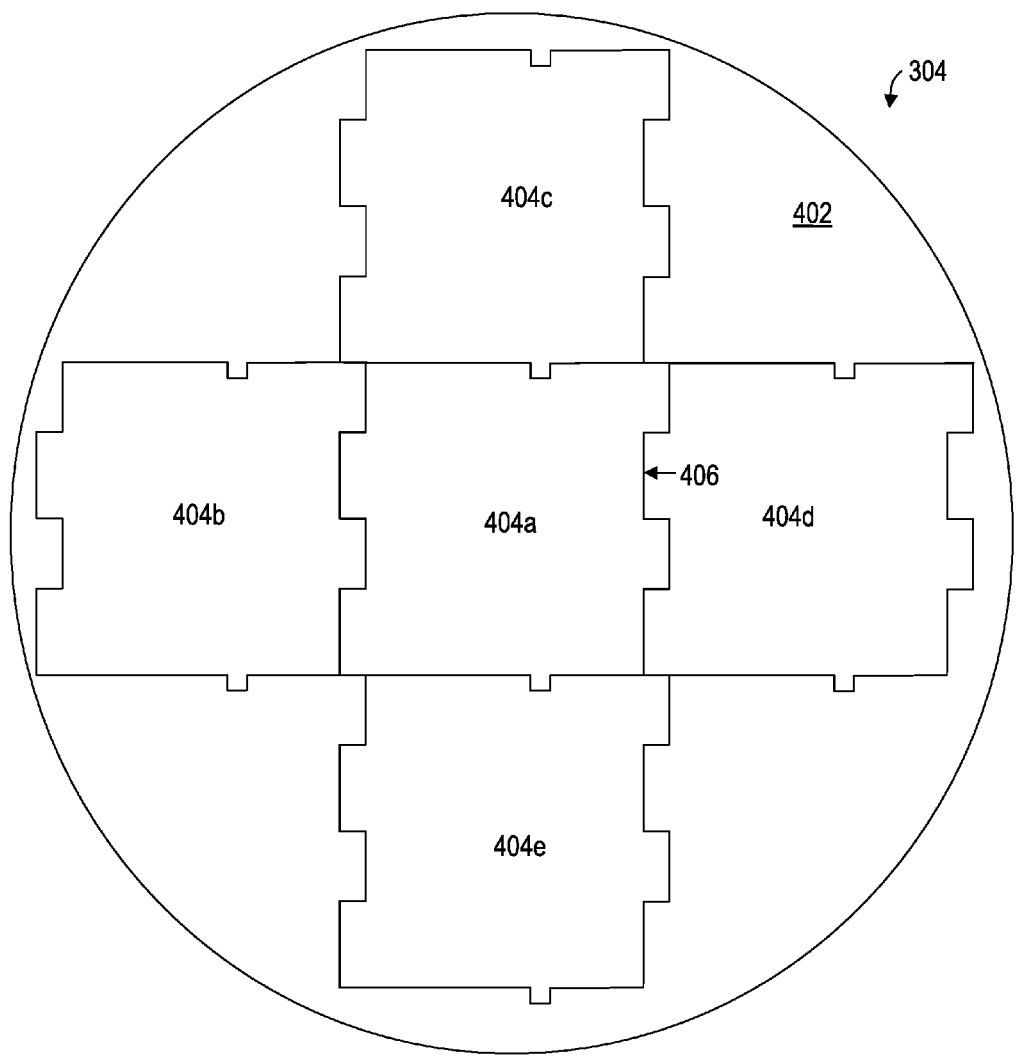

The substrate chuck 302 is configured to hold the substrate 304, similar to the substrate chuck 104 and the substrate 102 described herein with respect to FIG. 1. A portion of the substrate 304 is shown in FIG. 4, with the substrate 304 including a surface 402 having a plurality of fields 404a, 404b, 404c, 404d, 404e (collectively referred to as fields 404); however, the substrate 304 can include any number of full or partial fields. As illustrated, a first field 404a is positioned directly adjacent to each of the fields 404b, 404c, 404d, 404e. In some examples, a gap between adjacent fields 404 can be zero microns, as in the case of abutting fields, to tens of microns. In some examples, the first field 404a has a non-rectangular shape outline 406, described further herein. In some examples, one or more of the other fields 404 has the non-rectangular shape outline 406. In some examples, the fields 404 are tessellated with each other based on the non-rectangular shape outline 406 of each of the fields 404. That is, in some examples, the non-rectangular shape outline 406 of each of the fields 404 provides for a repeating pattern of the fields 404 on the surface 402 of the substrate 304. FIG. 6 illustrates a further example of the repeating pattern of the fields 404 on the surface 402 of the substrate 304.

Referring again to FIG. 3, the template chuck 306 is configured to hold the template 308, similar to the template chuck 128 and the template 108 described herein with respect to FIG. 1. The template 308 includes a patterning surface 330, similar to the patterning surface 112. The imprint head 310 is coupled to the template chuck 306 and configured to adjust a distance between the surface 402 of the substrate 304 and the patterning surface 330 of the template 308. The imprint head 310 is similar to the imprint head 130 of FIG. 1. The ultraviolet light source 314 is configured to provide an ultraviolet light beam 332. The lens array 316 is configured to focus the ultraviolet light beam 332, and in particular, convert the ultraviolet light beam 332 into a well-defined light beam with homogeneous intensity, and transmit (project) the same to the DMD 312.

The DMD 312 directs the ultraviolet light beam 332 towards the substrate 304 along a path 350. In some examples, the imaging optics 318 focuses and resizes the dimensions of the ultraviolet light beam 332 to match the size and the shape of a field 404. In some examples, the DMD 312 includes hundreds of thousands to over two million individually controlled mirrors that selectively reflect the ultraviolet light beam 332 towards the substrate 304, described further herein. As a result, the DMD 312 facilities targeted exposure of the fields 404, for example, an exposure area of approximately 20 micrometers, with an edge resolution of 1 μm or less for a field size of 26 millimeters by 33 millimeters.

The processor 320 is in communication with the imprint head 310. The processor 320 provides a signal to the imprint head 310 such that the imprint head 310 adjusts the distance between the surface 402 of the substrate 304 and the patterning surface 330 of the template 308, described further herein. The processor 320 is also in communication with the DMD 312. The processor 320 provides signals to the DMD 312 to i) adjust an exposure profile of the ultraviolet light beam 332 and ii) direct the ultraviolet light beam 332 having the adjusted exposure profile to the substrate 304, described further herein.

The system 300, as mentioned herein, directs the ultraviolet light beam 332 towards the substrate 304, and further, directs such with a customizable exposure profile, customizable energy profile, or both, described herein. Specifically, in some implementations, a polymerizable composition is disposed in the first field 404a of the substrate 304. For example, a fluid dispense system similar to the fluid dispense system 132 of FIG. 1 can dispose the polymerizable composition in the first field 404a of the substrate 304.

The processor 320 provides a signal to the imprint head 310 such that the imprint head 310, in response to the signal, adjusts the distance between the surface 402 of the substrate 304 and the patterning surface 330 of the template 308 to have the patterning surface 330 of the template 308 contact the polymerizable composition disposed in the first field 404a of the substrate 304.

The processor 320 identifies the non-rectangular shape outline 406 of the first field 404a, and generates a signal based on the non-rectangular shape outline 406 of the first field 404a. The processor 320 provides this signal to the DMD 312 such that the DMD 312 adjusts the exposure profile of the ultraviolet light beam 332 based on the non-rectangular shape outline 406 of the first field 404a to provide a non-rectangular exposure profile of the ultraviolet light beam 332. Specifically, the exposure profile of the ultraviolet light beam 332 is perpendicular to the path 350 along which the ultraviolet light beam 332 is directed. The DMD 312, in response to the signal from the processor 320, adjusts parameters of the ultraviolet light beam 332 to achieve the non-rectangular exposure profile.

In some examples, the DMD 312 can adjust/control the individual mirrors thereof to reflect the ultraviolet light beam 332 towards the substrate 304 or away from the substrate 304. Adjusting the mirrors of the DMD 312 can include selectively having first mirrors positioned to reflect a portion of the incoming ultraviolet light beam 332 (from the lens array 316) towards the substrate 304; and can include selectively having second, differing mirrors positioned to reflect the incoming ultraviolet light beam 332 (from the lens array 316) away from the substrate 304.

In some examples, adjusting the exposure profile of the ultraviolet light beam 332 includes matching the exposure profile of the ultraviolet light beam 332 to the non-rectangular shape outline 406 of the first field 404a to provide the non-rectangular exposure profile of the ultraviolet light beam 332. For example, the processor 320, based on identification of the non-rectangular shape outline 406 of the first field 404a, generates the signal provided to the DMD 312 such that in response to the signal, the DMD 312 has a subset of the mirrors positioned to reflect a portion of the incoming ultraviolet light beam 332 towards the substrate 304, with the reflected portion of the ultraviolet light beam 332 (e.g., beam profile) matching the non-rectangular shape outline 406.

In some examples, the exposure profile of the ultraviolet light beam 332 is adjusted prior to separation of the polymerized composition positioned in the first field 404a of the substrate 304 and the patterning surface 330 of the template 308. That is, the DMD 312 adjusts the exposure profile of the ultraviolet light beam 332 while the template 308 is in contact with the polymerizable composition in the first field 404a.

In some implementations, the processor 320, after adjusting the exposure profile of the ultraviolet light beam 332 to the non-rectangular exposure profile, provides a further signal to the DMD 312 such that the DMD 312, in response to the further signal, directs the ultraviolet light beam 332 having the non-rectangular exposure profile towards the substrate 304. Specifically, the DMD 312 directs the ultraviolet light beam 332 having the non-rectangular exposure profile towards the substrate 304 such that the ultraviolet light beam 332 only irradiates the first field 404a of the substrate 304. In some examples, the ultraviolet light beam 332 only irradiates the first field 404a of the substrate 304 while the patterning surface 330 of the template 308 contacts the polymerizable composition in the first field 404a.

In some examples, the DMD 312, in response to the further signal, inhibits the ultraviolet light beam 332 from irradiating the remaining fields 404 (e.g., a second field 404b) of the substrate 304. Specifically, by the DMD 312 directing the ultraviolet light beam 332 having the non-rectangular exposure profile towards the substrate 304 such that the ultraviolet light beam 332 only irradiates the first field 404a of the substrate 304, the DMD 312 inhibits the ultraviolet light beam 332 from irradiating the remaining fields 404 (e.g., a second field 404b) of the substrate 304.

Referring to FIG. 4, in some examples, the first field 404a tessellates with the other fields 404 that are adjacent to the first field 404a. That is, each field 404 includes the same (or substantially the same) non-rectangular shape outline 406. As a result, each field 404 of the fields 404 is able to tessellate with each adjacent field 404 of the fields 404. In some examples, the processor 320 provides the signal to the DMD 312 such that the DMD 312 adjusts the exposure profile of the ultraviolet light beam 332 based on the non-rectangular shape outline 406 of the first field 404a to provide a corresponding shape exposure profile of the ultraviolet light beam 332.

In some implementations, an energy profile of the ultraviolet light beam 332 can be adjusted. That is, the amount of energy transmitted to the substrate 304, and specifically, the fields 404, can be modulated. In some examples, the processor 320 determines an energy threshold to cure the polymerizable composition disposed in the first field 404a of the substrate 304. The energy threshold can be based on one or more factors, such as the particular polymerizable composition, the environment of the polymerizable composition, and the like.

The processor 320 generates a signal based on the determined energy threshold to cure the polymerizable composition disposed in the first field 404a of the substrate 304. The processor 320 provides this signal to the DMD 312 such that the DMD 312 adjusts the energy profile of the ultraviolet light beam 332 based on the energy threshold to provide an adjusted energy profile that is associated with a particular duty cycle (e.g., an amount of time per cycle that the ultraviolet light beam 332 irradiates the substrate 304). The DMD 312, in response to the signal from the processor 320, adjusts the energy profile of the ultraviolet light beam 332 to provide the adjusted energy profile of the ultraviolet light beam 332. In some examples, the duty cycle is associated with application of differing dosages of the ultraviolet light beam 332 to differing fields 404 of the substrate 304, or portions of the fields 404.

In some examples, the processor 320 provides a further signal to the DMD 312 such that the DMD 312 directs the ultraviolet light beam 332 having i) the non-rectangular exposure profile and ii) the adjusted energy profile towards the substrate 304. The processor 320 provides the further signal to the DMD 312 after i) adjusting the exposure profile of the ultraviolet light beam 332 to the non-rectangular exposure profile and ii) adjusting the energy profile of the ultraviolet light beam 332 to the adjusted energy profile. Specifically, the DMD 312 directs the ultraviolet light beam 332 having i) the non-rectangular exposure profile and ii) the adjusted energy profile towards the substrate 304 such that the ultraviolet light beam 332 only irradiates the first field 404a of the substrate 304 at the particular duty cycle. In some examples, the ultraviolet light beam 332 only irradiates the first field 404a of the substrate 304 during at least a portion of the time when the patterning surface 330 of the template 308 contacts the polymerizable composition in the first field 404a.

For example, as mentioned herein, the DMD 312 can adjust/control the individual mirrors thereof to either reflect the ultraviolet light beam 332 towards to the substrate 304 or away from the substrate 304. Adjusting the mirrors of the DMD 312 can include selectively having first mirrors positioned to reflect a portion of the incoming ultraviolet light beam 332 (from the lens array 316) towards the substrate 304; and can include selectively having second, differing mirrors positioned to reflect the incoming ultraviolet light beam 332 (from the lens array 316) away from the substrate 304. For a field 404 of the substrate 304 where the polymerizable composition positioned therein requires 50% less energy to cure than an adjacent region 404, the mirrors of the DMD 312 reflect the incoming ultraviolet light beam 332 towards the substrate 304 at a 50% duty cycle. In some examples, to achieve the 50% duty cycle, a subset of the mirrors of the DMD 312 can reflect the incoming ultraviolet light beam 332 towards the substrate 304; each of the mirrors of the DMD 312 can reflect the incoming ultraviolet light beam 332 for a predetermined amount of time; or both.

In some examples, the energy profile of the ultraviolet light beam 332 is adjusted prior to separation of the polymerized composition positioned in the first field 404a of the substrate 304 and the patterning surface 330 of the template 308. That is, the DMD 312 adjusts the exposure profile of the ultraviolet light beam 332 while the template 308 is in contact with the polymerizable composition in the first field 404a.

Figure 5:
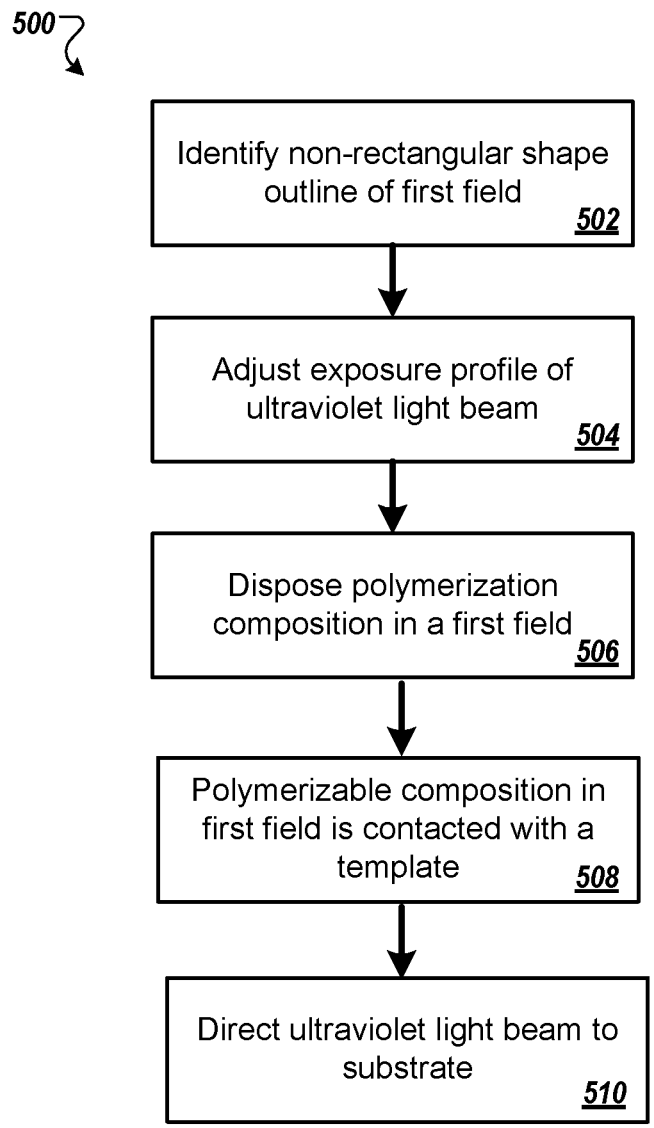
FIG. 5 illustrates a flow chart of an example method for adjusting a shape profile of the ultraviolet light beam.

FIG. 5 illustrates an example method for directing an ultraviolet light beam towards a substrate. The process 500 is illustrated as a collection of referenced acts arranged in a logical flow graph. The order in which the acts are described is not intended to be construed as a limitation, and any number of the described acts can be combined in another order and/or in parallel to implement the process.

A non-rectangular shape outline of a first field of a substrate is identified (502). For example, the processor 320 identifies the non-rectangular shape outline 406 of the first field 404a. In some examples, the first field is directly adjacent to a second field. For example, the first field 404a is adjacent to the second field 404b. An exposure profile of an ultraviolet light beam is adjusted based on the non-rectangular shape outline of the first field to provide a non-rectangular exposure profile of the ultraviolet light beam (504). For example, the DMD 312 adjusts the exposure profile of the ultraviolet light beam 332 based on the non-rectangular shape outline 406 of the first field 404a to provide a non-rectangular exposure profile of the ultraviolet light beam 332.

A polymerizable composition is disposed in a first field of a substrate (506). For example, a fluid dispense system disposes the polymerizable composition in the first field 404a of the substrate 304. The polymerizable composition in the first field is contacted with an imprint lithography template (508). For example, the processor 320 provides a signal to the imprint head 310 such that the imprint head 310, in response to the signal, adjusts the distance between the surface 402 of the substrate 304 and the patterning surface 330 of the template 308 to have the patterning surface 330 of the template 308 contact the polymerizable composition disposed in the first field 404a of the substrate 304. While contacting the polymerizable composition in the first field with the imprint lithography template, the ultraviolet light beam having the non-rectangular exposure profile is directed towards the substrate such that the ultraviolet light beam irradiates only the first field of the substrate (510). For example, the DMD 312 directs the ultraviolet light beam 332 having the non-rectangular exposure profile towards the substrate 304 such that the ultraviolet light beam 332 only irradiates the first field 404a of the substrate 304.

What is claimed is:

1. An imprint lithography method comprising:
    identifying a non-rectangular shape outline of a first field of a substrate, the first field directly adjacent to a second field;
    adjusting an exposure profile of an ultraviolet light beam based on the non-rectangular shape outline of the first field to provide a non-rectangular exposure profile of the ultraviolet light beam;
    disposing a polymerizable composition on the first field of the substrate;
    contacting the polymerizable composition in the first field with an imprint lithography template; and
    while contacting the polymerizable composition in the first field with the imprint lithography template, directing the ultraviolet light beam having the non-rectangular exposure profile towards the substrate such that the ultraviolet light beam irradiates only the first field of the substrate.

2. The method of claim 1, wherein the non-rectangular exposure profile of the ultraviolet light beam is perpendicular to a path along which the ultraviolet light beam is directed.

3. The method of claim 1, wherein adjusting the exposure profile of the ultraviolet light beam comprises adjusting one or more parameters of the ultraviolet light beam to achieve the non-rectangular exposure profile of the ultraviolet light beam.

4. The method of claim 3, wherein adjusting the one or more parameters of the ultraviolet light beam comprises inhibiting a portion of the ultraviolet light beam from irradiating the substrate.

5. The method of claim 1, wherein adjusting the exposure profile of the ultraviolet light beam comprises matching the exposure profile of the ultraviolet light beam to the non-rectangular shape outline of the first field to provide the non-rectangular exposure profile of the ultraviolet light beam.

6. The method of claim 5, wherein matching the exposure profile of the ultraviolet light beam to the non-rectangular shape outline of the first field comprises:
    identifying a first portion of the ultraviolet light beam that corresponds to the first field of the substrate;
    identifying a second portion of the ultraviolet light beam that corresponds to the second field of the substrate;
    directing the first portion of the ultraviolet light beam towards the substrate such that the first portion of the ultraviolet light beam irradiates only the first field of the substrate; and
    inhibiting the second portion of the ultraviolet light beam from irradiating the second field of the substrate.

7. The method of claim 1, wherein the second field of the substrate is not irradiated with the ultraviolet light beam.

8. The method of claim 1, wherein the first field tessellates with the second field of the substrate based on the non-rectangular shape outline of the first field of the substrate.

9. The method of claim 1, comprising:
    determining an energy threshold to cure the polymerizable composition disposed in the first field of the substrate;
    adjusting an energy profile of the ultraviolet light beam based on the energy threshold to provide an adjusted energy profile associated with a particular duty cycle; and
    while contacting the polymerizable composition in the first field with the imprint lithography template, directing the ultraviolet light beam having the non-rectangular exposure profile and the adjusted energy profile towards the substrate such that the ultraviolet light beam irradiates only the first field of the substrate at the particular duty cycle.

10. An imprint lithography system comprising
    a substrate chuck configured to hold a substrate, the substrate comprising a surface having a first field and a second field, the first field directly adjacent to the second field, the first field associated with a non-rectangular shape outline;
    a template chuck configured to hold an imprint lithography template, the imprint lithography template comprising a patterning surface;
    an imprint head coupled to the template chuck and configured to adjust a distance between the surface of the substrate and the patterning surface of the imprint lithography template;
    a digital micromirror device (DMD) configured to direct an ultraviolet light beam towards the substrate; and
    a processor in communication with the DMD and the imprint head, the processor configured to:
        i) provide a first signal to the DMD to adjust an exposure profile of the ultraviolet light beam based on the non-rectangular shape outline of the first field to provide a non-rectangular exposure profile of the ultraviolet light beam, and
        ii) provide a second signal to the DMD to direct the ultraviolet light beam having the non-rectangular exposure profile towards the substrate such that the ultraviolet light beam irradiates only the first field of the substrate.

11. The system of claim 10, comprising an ultraviolet light source configured to provide the ultraviolet light beam.

12. The system of claim 10, wherein, in response to the first signal, the DMD adjusts one or more parameters of the ultraviolet light beam to achieve the non-rectangular exposure profile of the ultraviolet light bream.

13. The system of claim 10, wherein, in response to the second signal, the DMD inhibits a portion of the ultraviolet light beam from irradiating the substrate.

14. The system of claim 10, wherein the first field tessellates with the second field of the substrate based on the non-rectangular shape outline of the first field of the substrate.

15. The system of claim 10, wherein the processor is configured to provide the first signal to the DMD to match the exposure profile of the ultraviolet light beam to the non-rectangular shape outline of the first field to provide the non-rectangular exposure profile of the ultraviolet light beam.

16. The system of claim 10, wherein the processor is configured to provide the second signal to the DMD to i) direct a first portion of the ultraviolet light beam towards the substrate such that the first portion of the ultraviolet light beam irradiates only the first field of the substrate and ii) inhibit a second portion of the ultraviolet light beam from irradiating the second field of the substrate.

17. An imprint lithography method of manufacturing an article, the method comprising:
   identifying a non-rectangular shape outline of a first field of a substrate, the first field directly adjacent to a second field;
   adjusting an exposure profile of an ultraviolet light beam based on the non-rectangular shape outline of the first field to provide a non-rectangular exposure profile of the ultraviolet light beam;
   disposing a polymerizable composition on the first field of the substrate;
   contacting the polymerizable composition in the first field with an imprint lithography template;
   while contacting the polymerizable composition in the first field with the imprint lithography template, directing the ultraviolet light beam having the non-rectangular exposure profile towards the substrate such that the ultraviolet light beam irradiates only the first field of the substrate to yield a polymeric layer in contact with the imprint lithography template; and
   separating the imprint lithography template from the polymeric layer to yield the article.

18. The method of claim 17, wherein adjusting the exposure profile of the ultraviolet light beam includes adjusting one or more parameters of the ultraviolet light beam to achieve the non-rectangular exposure profile of the ultraviolet light beam.

19. The method of claim 18, wherein adjusting the one or more parameters of the ultraviolet light beam comprises inhibiting a portion of the ultraviolet light beam from irradiating the substrate.

20. The method of claim 17, wherein the first field tessellates with the second field of the substrate based on the non-rectangular shape outline of the first field of the substrate.

* * * * *